US010164595B2

(12) United States Patent
Bergren et al.

(10) Patent No.: US 10,164,595 B2
(45) Date of Patent: Dec. 25, 2018

(54) CLIPPED AMPLIFIER

(71) Applicants: National Research Council of Canada, Ottawa (CA); The Governors of the University of Alberta, Edmonton (CA)

(72) Inventors: Adam Johan Bergren, Edmonton (CA); Richard McCreery, Edmonton (CA)

(73) Assignees: The Governors of the University of Alberta, Edmonton (CA); National Research Council of Canada, Ottawa (CA)

( * ) Notice: Subject to any disclaimer, the term of this patent is extended or adjusted under 35 U.S.C. 154(b) by 0 days.

(21) Appl. No.: 14/909,706

(22) PCT Filed: Aug. 14, 2014

(86) PCT No.: PCT/CA2014/050771
§ 371 (c)(1),
(2) Date: Feb. 2, 2016

(87) PCT Pub. No.: WO2015/021552
PCT Pub. Date: Feb. 19, 2015

(65) Prior Publication Data
US 2016/0191008 A1 Jun. 30, 2016

Related U.S. Application Data

(60) Provisional application No. 61/865,905, filed on Aug. 14, 2013.

(51) Int. Cl.
G10H 1/00 (2006.01)
G10H 3/18 (2006.01)
(Continued)

(52) U.S. Cl.
CPC ............... *H03G 7/08* (2013.01); *G10H 3/187* (2013.01); *H03F 1/34* (2013.01); *H03F 1/342* (2013.01);
(Continued)

(58) Field of Classification Search
CPC ........... G10H 1/0091; G10H 2210/311; G10H 3/187; G10H 1/16
(Continued)

(56) References Cited

U.S. PATENT DOCUMENTS 4,180,707 A 12/1979 Moog
4,877,981 A 10/1989 Gomes
(Continued)

FOREIGN PATENT DOCUMENTS

CA 2 433 887 A1 8/2002
JP 54-153855 A 12/1979
(Continued)

OTHER PUBLICATIONS

International Search Report and Written Opinion dated Nov. 3, 2014, issued in corresponding International Application No. PCT/CA2014/050771, filed Aug. 14, 2014, 7 pages.
(Continued)

*Primary Examiner* — Alexander Jamal
(74) *Attorney, Agent, or Firm* — Christensen O'Connor Johnson Kindness, PLLC

(57) ABSTRACT

A clipping circuit for an amplifier, the clipping circuit using a tunneling junction. A molecular or other tunneling electronic-based component within a hybrid analog-tunneling circuit is used to produce soft or hard clipping capability with enhanced control over the output. The circuit may be used as a distortion circuit for an electric guitar signal or other electronic signals.

20 Claims, 13 Drawing Sheets

(51) Int. Cl.
*H03G 7/08* (2006.01)
*H03F 1/34* (2006.01)
*H03F 3/45* (2006.01)
*H03G 11/00* (2006.01)

(52) U.S. Cl.
CPC ....... *H03F 3/4508* (2013.01); *H03F 3/45179* (2013.01); *H03F 3/45475* (2013.01); *H03G 11/00* (2013.01); *G10H 1/0091* (2013.01); *G10H 2210/311* (2013.01)

(58) Field of Classification Search
USPC .................................................. 381/61, 118
See application file for complete search history.

(56) References Cited

U.S. PATENT DOCUMENTS

| | | | |
|---|---|---|---|
| 4,924,121 A | 5/1990 | Ohno | |
| 5,029,281 A | 7/1991 | Armstrong | |
| 5,032,796 A | 7/1991 | Tiers et al. | |
| 5,509,080 A | 4/1996 | Roberts | |
| 5,619,578 A | 4/1997 | Sondermeyer et al. | |
| 6,084,467 A | 7/2000 | Muza | |
| 6,570,430 B1* | 5/2003 | Zhou | H03F 1/3276 327/306 |
| 7,042,006 B2* | 5/2006 | McCreery | B82Y 10/00 257/103 |
| 7,112,366 B2* | 9/2006 | McCreery | B82Y 10/00 428/333 |
| 7,582,490 B2* | 9/2009 | Golovchenko | G01N 33/48721 204/192.13 |
| 8,362,559 B2 | 1/2013 | Tour et al. | |
| 2002/0109544 A1* | 8/2002 | Butler | H03F 3/3069 330/3 |
| 2003/0108728 A1* | 6/2003 | Heath | B82Y 10/00 428/209 |
| 2005/0253139 A1* | 11/2005 | Gorman | B82Y 10/00 257/46 |
| 2007/0090348 A1* | 4/2007 | McCreery | B82Y 10/00 257/40 |
| 2009/0090904 A1* | 4/2009 | Lee | H01L 51/0583 257/40 |
| 2009/0231011 A1* | 9/2009 | Baldringer | G10H 3/187 327/318 |
| 2010/0232614 A1* | 9/2010 | Myers | G10H 1/16 381/61 |

FOREIGN PATENT DOCUMENTS

| | | |
|---|---|---|
| JP | 56-115188 A | 9/1981 |
| JP | 62-065460 A | 3/1987 |
| JP | 04-211296 A | 8/1992 |
| JP | 07-263989 A | 10/1995 |
| JP | 2007-334273 A | 12/2007 |
| JP | 2012-151346 A | 8/2012 |

OTHER PUBLICATIONS

Bergren, A.J., et al., "Electronic Characteristics and Charge Transport Mechanisms for Large Area Aromatic Molecular Junctions," Journal of Physical Chemistry C 114(37):15806-15815, Sep. 2010.

Bergren, A.J., et al., "Molecular Electronics Using Diazonium-Derived Adlayers on Carbon With Cu Top Contacts: Critical Analysis of Metal Oxides and Filaments," Journal of Physics: Condensed Matter 20(37):374117, Aug. 2008, 11 pages.

Bergren, A.J., et al., "Musical Molecules: The Molecular Junction as an Active Component in Audio Distortion Circuits," Journal of Physics: Condensed Matter 28(9):094011, Feb. 2016, 11 pages.

Bryant, P., "Electro Harmonix: Big Muff Pi," Fuzz Central, © 2003, <http://fuzzcentral.ssguitar.com/schematics/bigmuffpischem.gif> [retrieved Nov. 29, 2016], 1 page.

"Discrete Semiconductors, Data Sheet: 1N4148; 1N4448, High-Speed Diodes," NXP Semiconductors, Product Data Sheet, Aug. 10, 2004 (supersedes data of Jan. 23, 2002), 9 pages.

Pakarinen, J., and D.T. Yeh, "A Review of Digital Techniques for Modeling Vacuum-Tube Guitar Amplifiers," Computer Music Journal 33(2):85-100, Jun. 2009.

Notice of Reasons for Rejection dated Aug. 21, 2018, issued in corresponding Japanese Application No. 2016-533760, filed Aug. 14, 2018, 12 pages.

* cited by examiner

Assumes correct bias voltages for transistor operation

Assumes correct bias voltages for transistor operation

CLIPPED AMPLIFIER

TECHNICAL FIELD

Amplifier clipping circuits.

BACKGROUND

Amplification of audio signals can be carried out using various methods, including analog, digital, and vacuum tube circuitry. While each method has distinct advantages/disadvantages, amplification of electric guitar signals is most often carried out using vacuum tube-based amplifier circuits. Part of the reason for the continued popularity of tube amplifiers for this application involves the way in which a tube amplifier responds when overloaded. When a tube amplifier is overloaded, the signal is clipped in a distinct way (relative to other amplification methods), often referred to as "soft." _ENREF_2 Overloading a solid state amplifier produces "harsh" and "buzzy" sounds, which are often subjectively evaluated as inferior. As a result, beginning in the late 1970s (shortly after the introduction and largely the failure of the first solid state amplifiers) a variety of analogue devices that were specifically designed to emulate tube-type clipping appeared on the market. These devices used circuitry designed with gain compression (soft clipping) as a primary goal. Subsequently, this market exploded in the last several decades to include a large number of distortion circuits.

One of the most popular ways to simulate soft clipping involves placing parallel diodes with opposite polarity in the feedback loop of an operational amplifier. Various configurations have been employed based on the take-off voltages, the degree of conduction onset of the diodes, and other factors. The many different configurations offer distinct sounds, and these are subjectively preferred by different users. Thus, there is significant demand for new components which can tailor the type of clipping and produce different types of distortion and "sounds."

Several examples of soft clipping circuits have been discussed in the patent literature _ENREF_6. All prior examples discuss general circuits using conventional components. We have not found prior art on incorporation of a molecular junction into a circuit in order to exploit the non-linear aspects of its electronic characteristics.

The molecular junction structure and its nonlinear response is the subject of previous patents assigned to Ohio State University, namely U.S. Pat. No. 7,112,366 and U.S. Pat. No. 7,042,006. To the authors' knowledge, no previous patents, presentations or publications disclose the use of molecular or tunneling junctions in audio distortion, processing, or amplification circuits.

SUMMARY

In an embodiment, a molecular or other tunneling electronic-based component within a hybrid analog-molecular circuit is used to produce soft or hard clipping capability with enhanced control over the output. The use of the molecular device imparts several advantages relative to conventional components, including a better ability to control the nature of waveform clipping and the added harmonic components, either at the time of manufacture, by varying the molecular junction temperature or by switching among several different molecular junctions during use. The molecular structure, layer thickness, and contacts of the molecular device affect the distribution of frequency components in the output waveform, thus permitting "tailoring" the output to have desirable properties. The non-linear nature of the electronic characteristics of the molecular devices, resulting from tunneling, is the basis for this functionality. Tunneling in molecular or inorganic devices may be assisted by the applied electric field or by electronic coupling, and may involve multiple tunneling steps and/or redox exchange between sites or traps. The circuit with amplifier is not limited to audio frequencies and may have different applications at higher frequencies.

There is provided a circuit comprising an amplifier, and a clipping circuit connecting an output of the amplifier to an input of the amplifier or to ground, the clipping circuit including an inorganic or organic tunneling junction.

In various embodiments, there may be included any one or more of the following features: the amplifier may be an operational amplifier having an inverting input, a non-inverting input, and an output. The clipping circuit may connect the output of the operational amplifier to the inverting input of the operational amplifier. An input line may be connected to the non-inverting input of the operational amplifier. A ground line may connect the input line to a ground, the ground line including a resistor. An input line may be connected to the inverting input of the operational amplifier, the input line including a resistor. A ground line may connect the non-inverting input of the operational amplifier to a ground. The amplifier may be a transistor amplifier. An input line may be connected to the input of the transistor amplifier and a ground line connecting the input line to a ground, the ground line including a resistor. The transistor amplifier may comprises a bipolar junction transistor having an emitter, collector and base, the emitter being connected to a ground, the base connected as the input of the amplifier and the collector connected as the output of the amplifier. The transistor amplifier may comprise a field-effect transistor having a source, a drain and a gate, the source being connected to a ground, the gate connected as the input of the amplifier and the drain connected as the output of the amplifier. The circuit may be used as a distortion circuit for an electric guitar signal or other electronic audio signal. The circuit may be operated by a method comprising altering the electronic output of the circuit by controlling the temperature of the tunneling junction.

These and other aspects of the device and method are set out in the claims, which are incorporated here by reference.

BRIEF DESCRIPTION OF THE FIGURES

Embodiments will now be described with reference to the figures, in which like reference characters denote like elements, by way of example, and in which.

DETAILED DESCRIPTION

Figure 1:
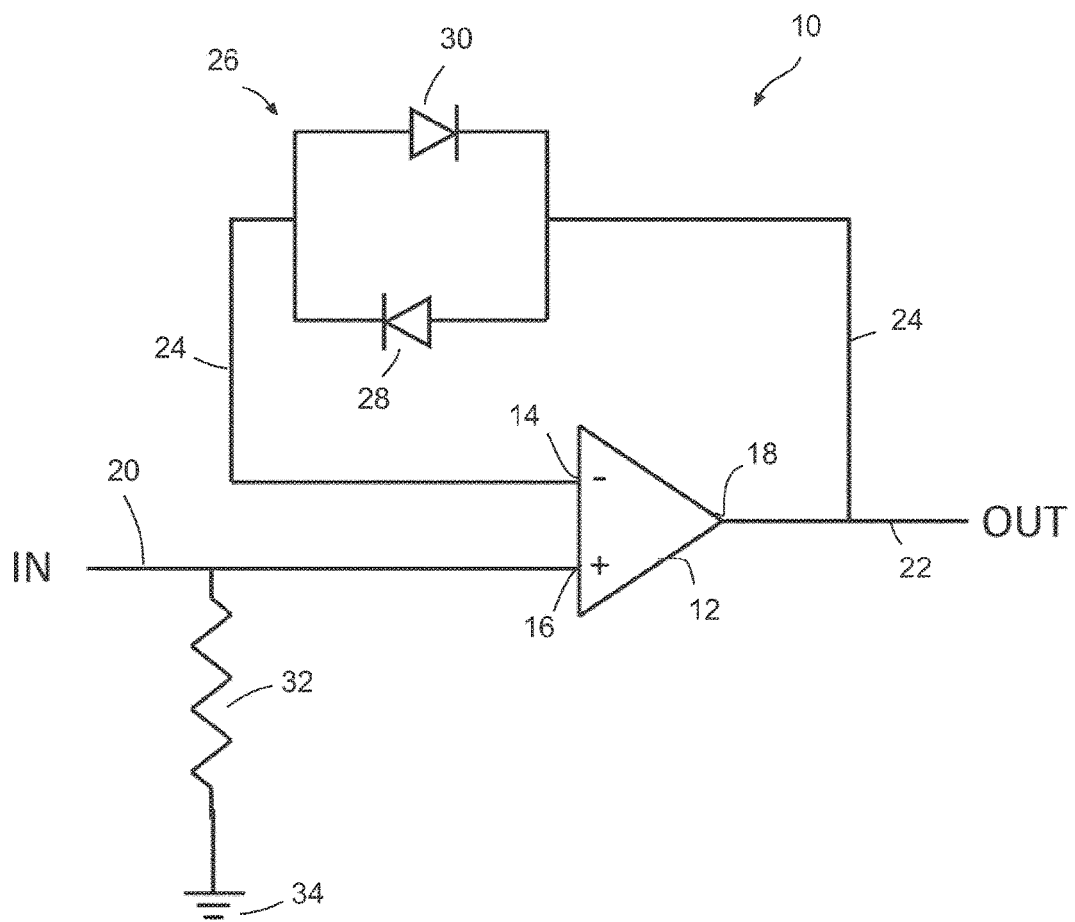
FIG. 1 is a circuit diagram for a conventional soft clipping circuit (prior art)
Figure 2:
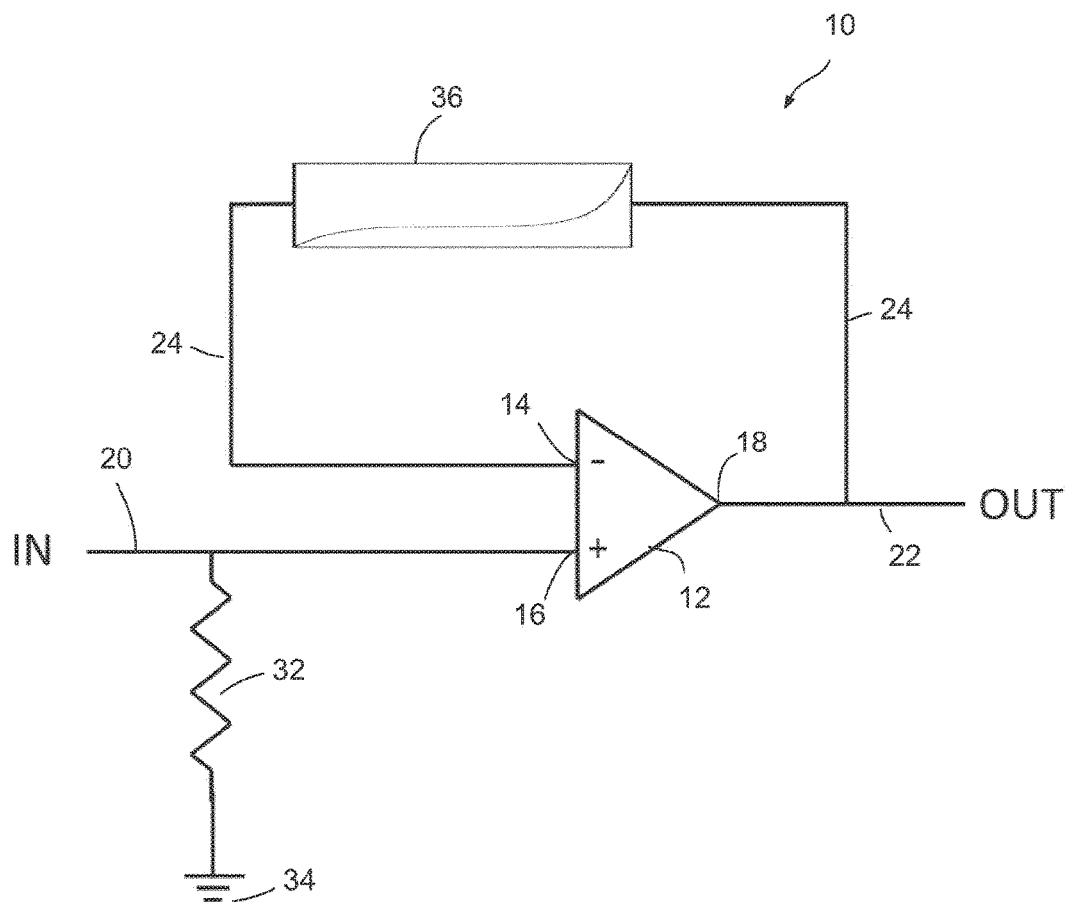
FIG. 2 is a circuit diagram for a soft clipping circuit using a tunneling junction, the symbol  being used to represent the tunneling junction.
Figure 8:
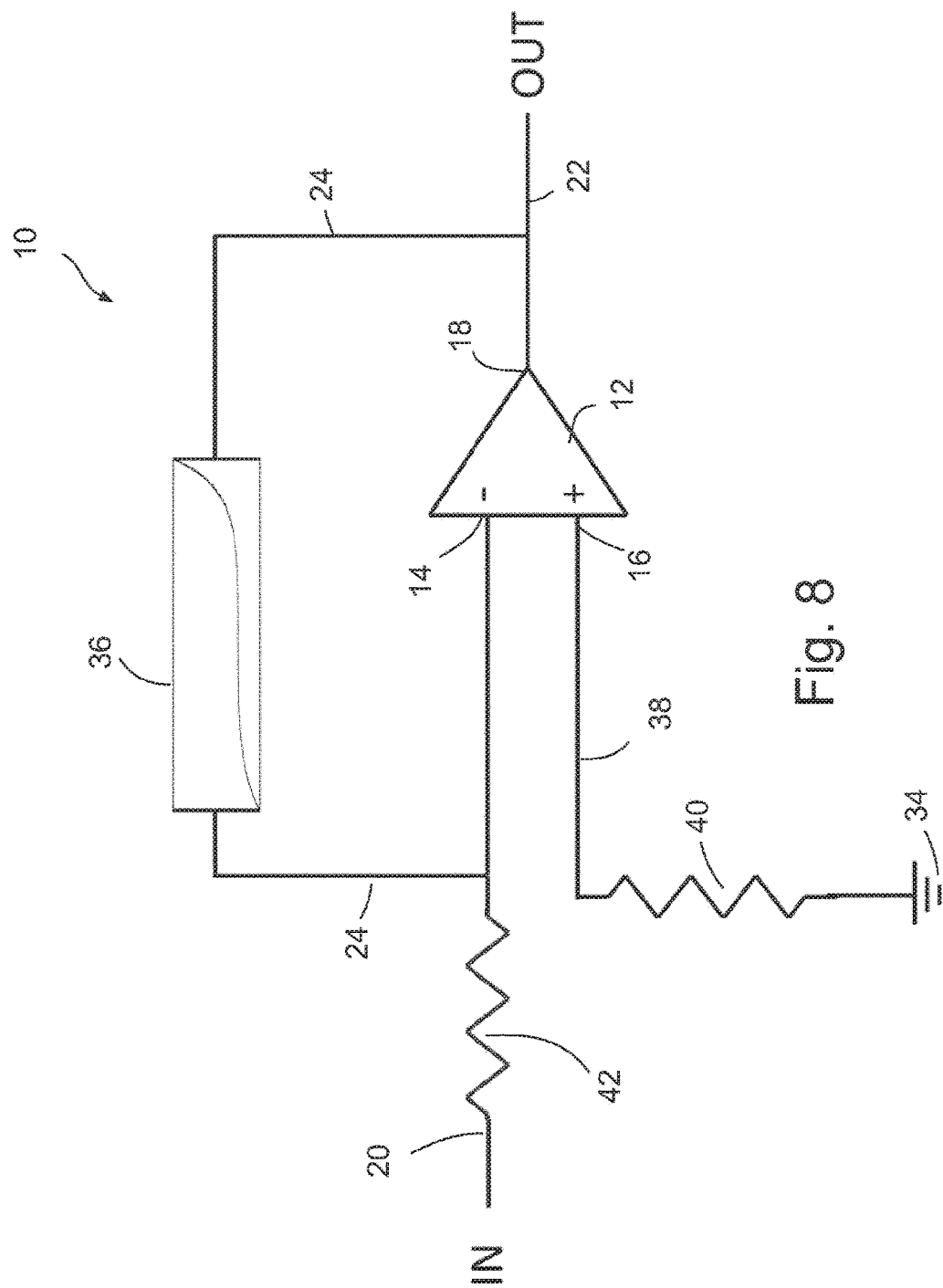
FIG. 8 is a circuit diagram for a soft clipping circuit using a tunneling junction in an inverting amplifier configuration.

A tunnelling junction is used in place of conventional components in the feedback loop of an operational amplifier to produce an audio distortion circuit, as illustrated in FIG. 2. FIG. 1 shows a conventional analog soft clipping circuit, while FIG. 2 shows the corresponding circuit employing a tunneling junction in place of conventional components. Here, the symbol ⌐⌐⌐ is used to represent the tunneling junction. FIG. 1 shows a feedback circuit 10 having an operational amplifier 12 with inverting input 14, non-inverting input 16, and output 18. Input line 20 is connected to the non-inverting input of the operational amplifier. Output line 22 is connected to the output of the operational amplifier. Feedback line 24 connects the output 18 of the operational amplifier to the inverting input 14 of the operational amplifier. The feedback line 24 includes a loop 26 with parallel diodes 28 and 30. Resistor 32 is connected to the input line and to a ground 34. FIG. 2 shows a circuit that is the same as the circuit of FIG. 1 except that the loop 26 with parallel diodes 28 and 30 is replaced with a tunneling junction 36. In an alternative embodiment shown in FIG. 8, the feedback loop could be configured in an inverting configuration with the input line 20 connected through a resistor 42 to the inverting input 14 instead of the non-inverting input 16. The feedback line 24 would still connect to the inverting input 14 as well. The resistor 42 may have different values in different embodiments. In some embodiments the resistor may have a resistance with a very low value. A further line 38 would connect the non-inverting input of the operational amplifier to a ground 34 through a resistor 40.

The tunnelling junction may be provided by a molecular junction as disclosed for example in U.S. Pat. No. 7,112,366, particularly an organic molecular junction. The content of U.S. Pat. No. 7,112,366 is hereby incorporated by reference where permitted by law. An exemplary molecular junction disclosed in U.S. Pat. No. 7,112,366 comprises a substrate for example conductive carbon having a contact surface and a monolayer of a plurality of substantially parallel molecular units attached to the contact surface through a conjugated bond. Molecular junctions may be made by the process described in the following papers, which are incorporated by reference herein: 1) Bergren, A. J.; McCreery, R. L.; Stoyanov, S. R.; Gusarov, S.; Kovalenko, A. J. Phys. Chem. C 2010, 114, 15806 according to which a conductor (e.g., carbon, gold) is used as the working electrode in a solution containing an aromatic diazonium ion (e.g., 1 mM concentration). A reductive potential program is applied during which the thickness of the resulting molecular layer can be controlled in the 2-6 nm range by changing the scan parameters. As an example, a single scan from +0.4 to −0.6 V at 0.2 V/s results in a 3.5 nm layer of azobenzene, while four scans within the same limits leads to a 5.0 nm thickness. Also, changing the negative limit from −0.6 to −0.5 V for a single scan results in a layer that is 2.8 nm thick; 2) Yan, H.; Bergren, A. J.; McCreery, R. L. *Journal of the American Chemical Society* 2011, 133, 19168 according to which top contacts can be applied on top of 1-6 nm molecular layers by electron beam evaporation of conductors, including carbon (from graphite rod source) and Cu; 3) Yan, H.; Bergren, A.; McCreery, R.; Della Rocca, M.; Martin, P.; Lafarge, P.; Lacroix, J. Proceedings of the National Academy of Sciences of the United States of America 2013, 110, 5326, according to which layers up to 22 nm in thickness can be deposited onto a conductor by utilizing the conductor as a working electrode in a solution that is prepared by dissolution of a precursor in a suitable solvent. The precursor is activated by adding an appropriate amount of tertbutylnitrite and stirring for 15 minutes, followed by potential programs similar to that described above. As an example, scanning from +0.4 V to −0.6 V once yields a 4.5 nm thickness, while scanning 10 times yields a 22 nm thickness.

The characteristics of the molecular component, and therefore the type and sound of the clipping that results can be tuned by using different molecules, thicknesses, junction geometries, and contact materials. In addition, the use of molecular junctions enables a wider range of distorted sounds to be generated, with enhanced control over the harmonic content of the resulting waveform. A further tunneling junction may comprise Al/AlOx/Cu or Al/AlOx/Au or other inorganic tunneling junctions. Such tunneling junctions may be used in the present invention instead of an organic molecular junction of the type disclosed in U.S. Pat. No. 7,112,366, as the tunneling effect of the junction causes the clipping behaviour described here, although the detailed behavior will vary depending on the detailed characteristics of the junction. The AlOx layer may be grown on Al metal by thermal oxidation, or on other conductors using atomic layer deposition (ALD) or vapor deposition. Alternatively, the AlOx may be replaced with a different metal oxide either grown on a metal by thermal oxidation, ALD or vapor deposition. Possible oxides may include those of Cr, Hf, Ti, Si, Cu, Ag, Zn, Sn and others, but in all cases would act as tunneling junctions similar in electronic behavior to the molecular junctions of U.S. Pat. No. 7,112,366.

Figure 3:
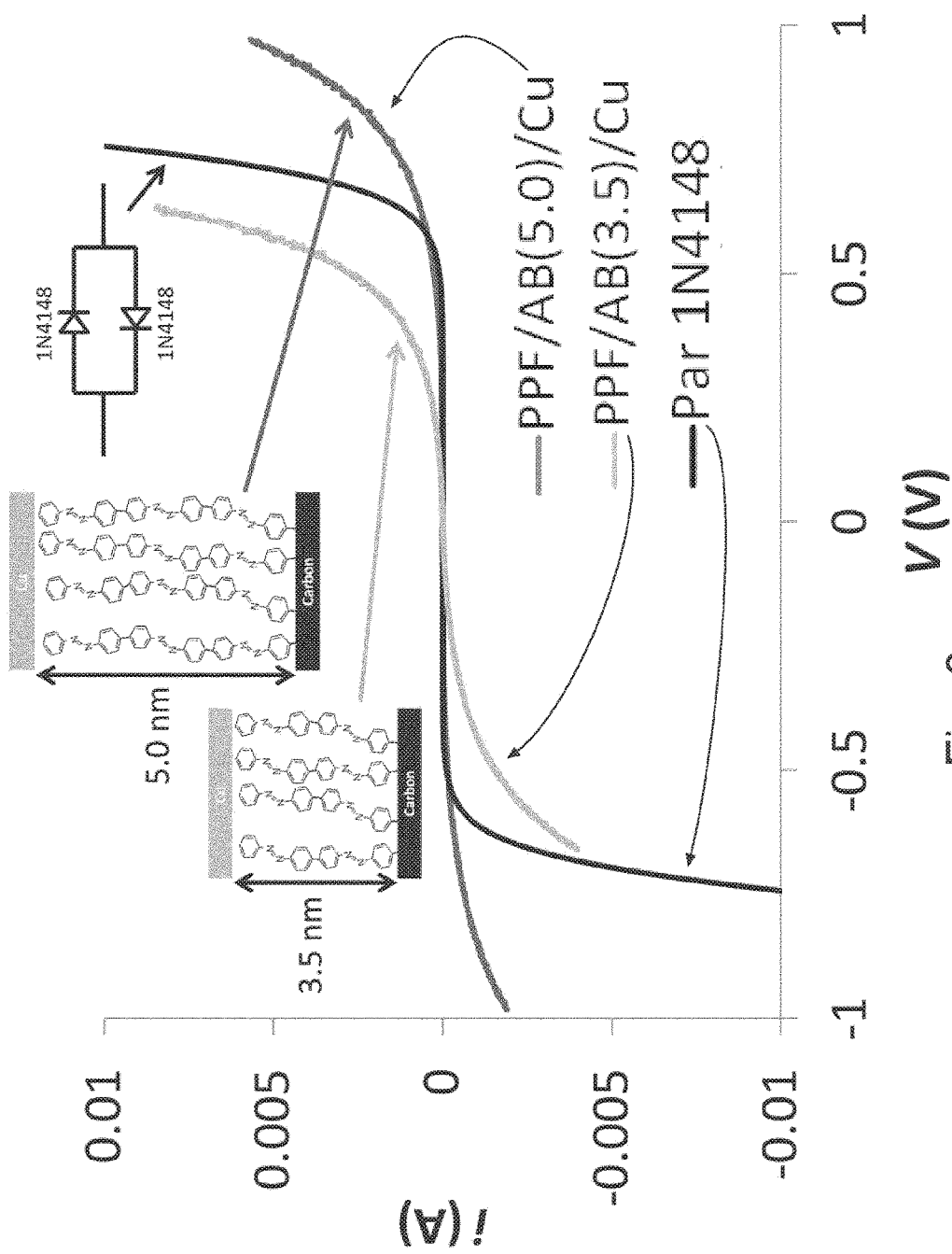
FIG. 3 is a graph showing the current-voltage characteristics of a conventional pair of parallel diodes (with reverse polarity) as well as a molecular junction more conductive than the parallel diodes and a molecular junction less conductive than the parallel diodes, where the molecular junction conductance is controlled by the thickness of the molecular component.

FIGS. 3-6 shows how molecular components can be used in a modified commercial distortion unit to create a range of waveforms. FIG. 3 compares the electronic properties of parallel diodes and two different molecular junctions. One molecular junction comprises a 3.5 nm thickness of azobenzene between two conductors and the other comprises a 5.0 nm thickness of azobenzene between two conductors. It is clear from FIG. 3 that the properties of molecular junctions can be made to simulate the parallel diodes, but also that molecular junctions can produce very different electronic behaviour. In particular, the more gradual onset of the thin molecular junction (3.5 nm azobenzene) at low voltage represents a typically desirable characteristic that can be controlled in a way not currently available using diodes.

In order to test the impact of using a molecular junction in a real-world circuit, a commercial distortion unit (BOSS SD-1 Super Overdrive™) was modified to accommodate systematic testing. The stock diode array was removed, and external connections to surface mounted jacks permitted substitution of any external components, including molecular junctions.

Figure 4:
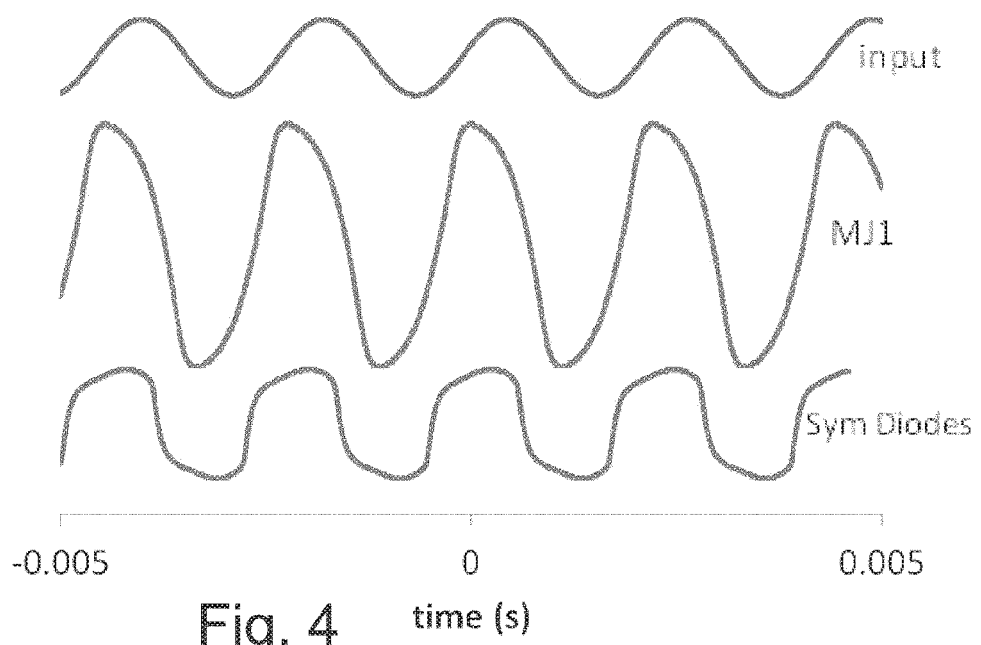
FIG. 4 is a graph showing a 400 Hz sine wave input waveform, peak-to-peak amplitude of roughly 1 volt, used as the input to a modified BOSS SD-1 Super Overdrive™ pedal and the resulting output waveforms for the circuit using a molecular junction and a diode array, the y-axis (voltage) positions of the curves shown being offset for clarity.
Figure 6:
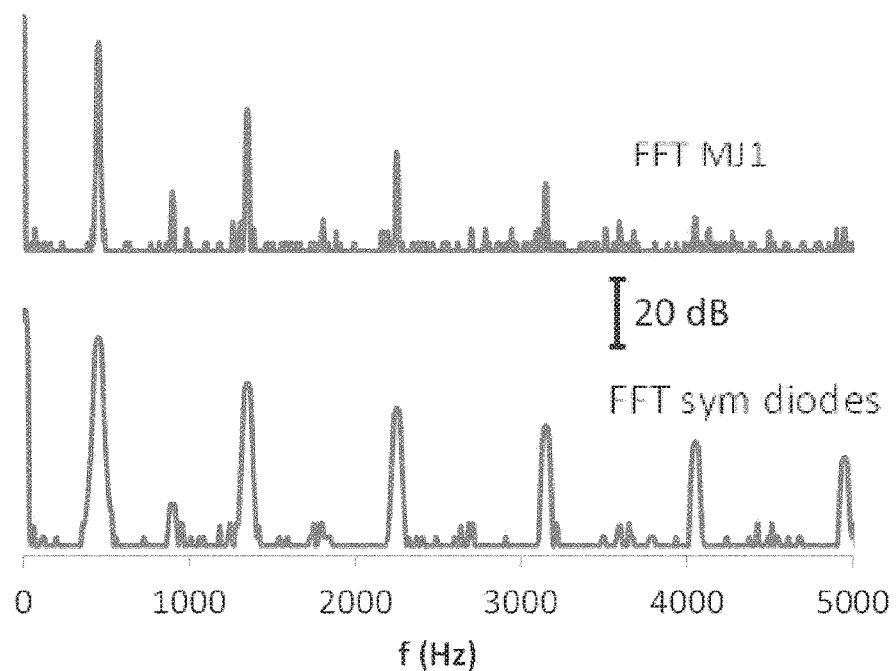
FIG. 6 is a graph of a Fourier analysis of the output waveforms of FIG. 4, the y-axis positions of the curves shown being offset for clarity (the y-axis scale bar has a length corresponding to 20 dB)

An input waveform of 1 VAC amplitude at 400 Hz was used to test the output of the modified SD-1, and the output waveforms with various components were determined. FIG. 4 shows the waveform input and output curves for various configurations, including the stock parallel diodes and a molecular junction. Clear differences are observed, indicating that molecular junctions will provide a different sound. In addition, as previously noted, the type of clipping achieved may be tuned by changing the structure of the molecular junction. In addition, the Fourier analysis shown in FIG. 6 shows differences in the harmonic content of the output depending on what component is wired into the circuit. In the circuit with the molecular junction, the output has harmonics that fall off more rapidly than with the parallel diodes.

Figure 5:
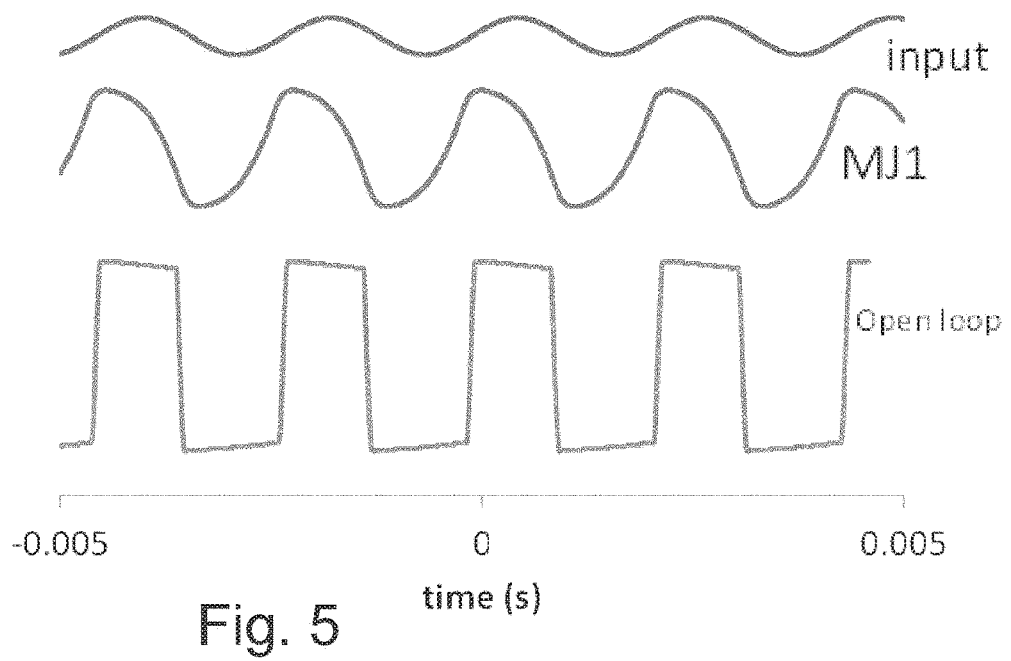
FIG. 5 is a graph of the input waveform from FIG. 4 and of the output waveform using a molecular junction from FIG. 4 along with an output waveform for the modified BOSS SD-1 Super Overdrive™ pedal where the contact with the molecular junction was intentionally broken, the y-axis positions of the curves shown being offset for clarity.

FIG. 5 shows a comparison of the output of the device with a molecular junction wired into the circuit (red curve) and when contact with the junction is broken by lifting one of the wires in contact with the junction (green curve, labeled "open loop"). The output of the device with an open circuit in the feedback loop represents hard op-amp based clipping, which is clearly avoided by including the molecular junction.

Currently used components in distortion circuits are based on Si and Ge diodes, which act as rectifiers. The choices of diode "on" voltages and the onset characteristics are limited by the inherent properties of the semiconductor junctions within the diodes. In addition, the harmonic components that are generated depend on the characteristics of the diodes, and the variety of "sounds" is therefore limited.

The use of a molecular junction, which has a tunable IV curve (by changing molecular structure and/or thickness) can provide a wider range of distortion sounds, harmonic content, etc., than currently available with semiconductor components. The much greater variety of molecular junctions should provide numerous alternatives to current components, whose properties depend on a small set of combinations of semiconductors and contact materials. In an embodiment, the distortion circuit is configured to have multiple tunneling junctions that can be selected by a switch operated by the user. In a different embodiment, the tunneling junction characteristics may be altered by changes in device temperature. Each tunneling junction may have different properties.

There are many possible ways to employ tunneling junctions in clipping circuits. In addition to the circuit shown in FIG. 1B, circuits that employ frequency filtering, level compression, additional gain stages, or other types of audio processing may be envisioned. For example, "stacked" distortion stages are possible, where the output of one distortion circuit is fed into the input of a second circuit, and either, both, or many of these stages can be based on conventional circuitry or employ a tunneling junction.

Figure 7:
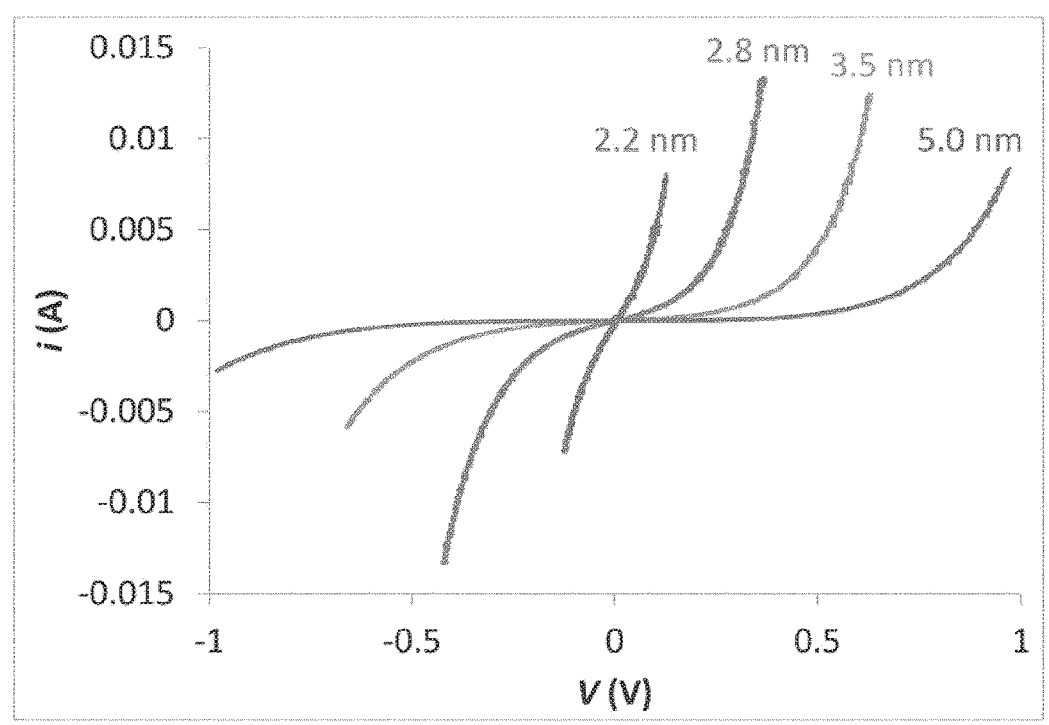
FIG. 7 is a graph of the current-voltage characteristics for (prior art) molecular junctions containing layers having 2.2 nm, 2.8 nm, 3.5 nm or 5.0 nm in thickness.

The non-linear resistor characteristic of molecular junctions is illustrated in FIG. 7, as previously disclosed in Bergren et al, J. Phys. Chem. C 2010. FIG. 7 illustrates the changes in the current voltage (i-V) characteristics of a molecular tunneling junction as the thickness of the molecular layer varies. The large sensitivity of quantum mechanical tunneling to distance, combined with the ability to control the thickness of the molecular layer in the sub-nm range enables a wide range of "onset voltages" (loosely defined as the inflection point in the curves shown in FIG. 7). The nature of the curvature in these i-V characteristics leads to the particular harmonic distortion added to the input signal when used in the circuit shown in FIG. 2.

Figure 9:
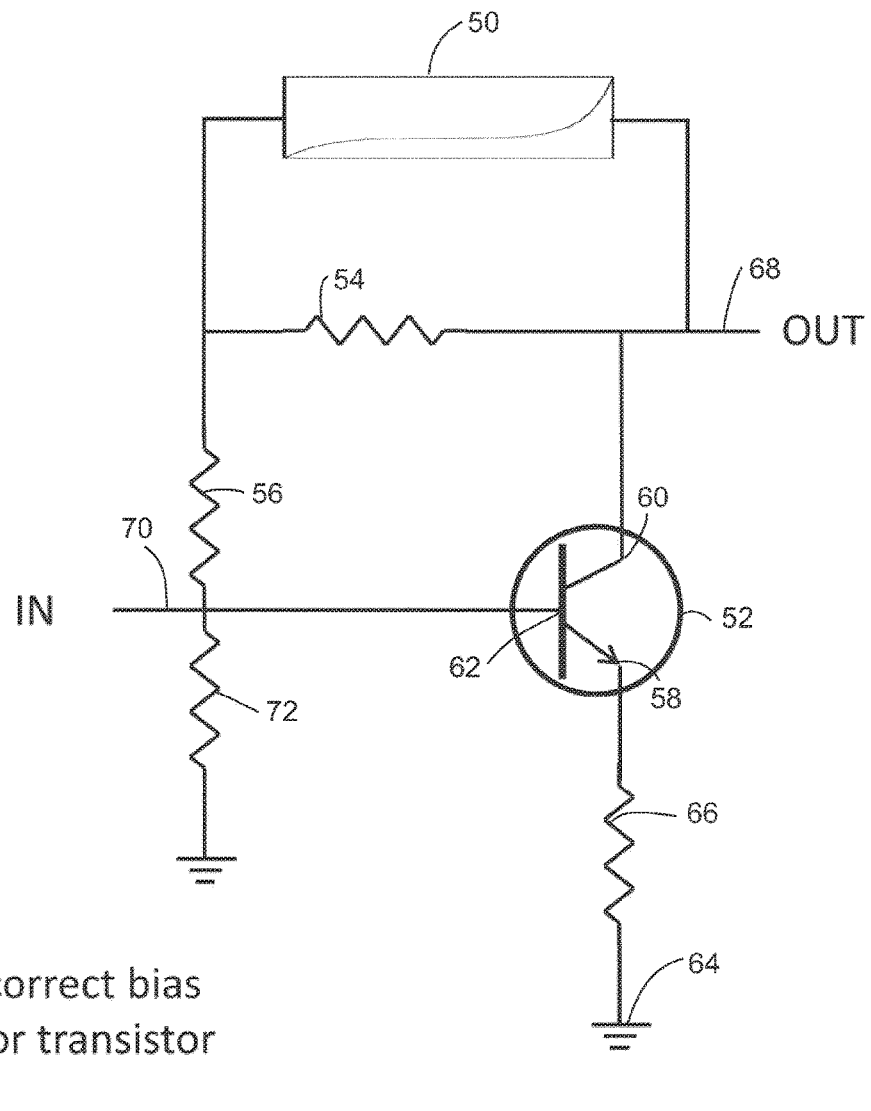
FIG. 9 is a circuit diagram for a clipping circuit using a tunneling junction with a bipolar junction transistor amplifier.
Figure 10:
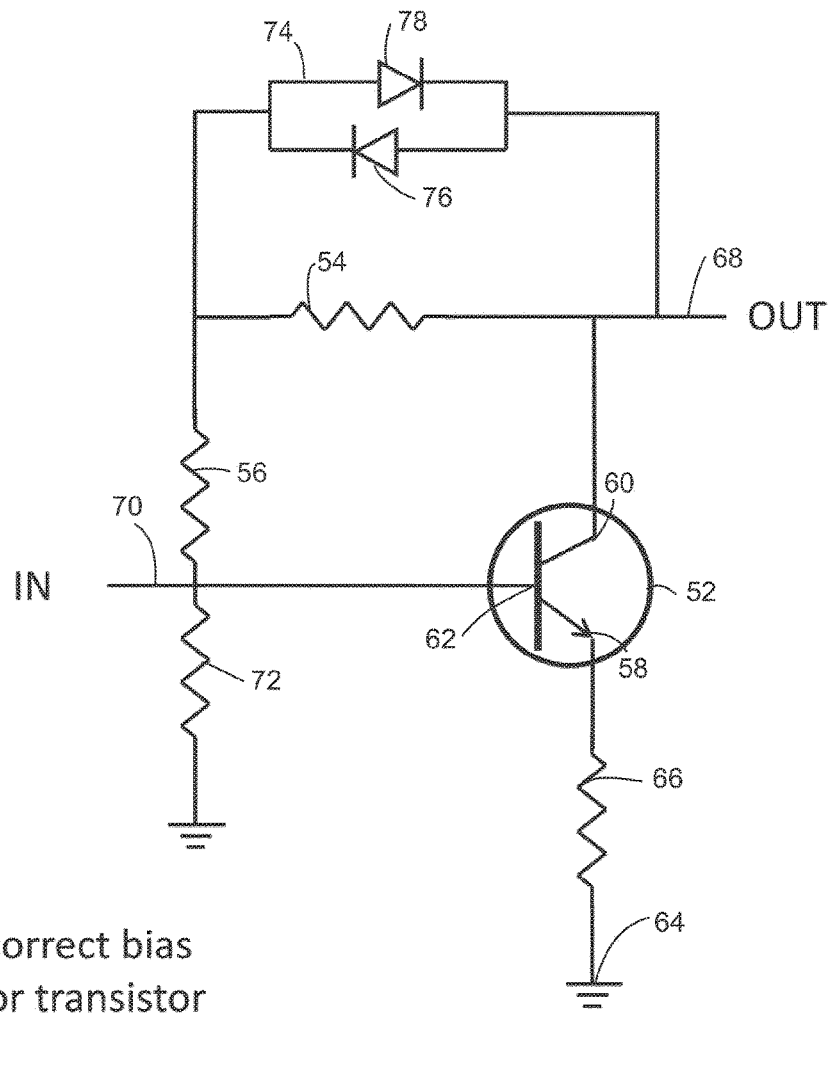
FIG. 10 is a circuit diagram showing a (prior art) clipping circuit using a pair of diodes with a bipolar junction transistor amplifier.

FIG. 9 shows a circuit diagram for a clipping circuit using a tunneling junction 50 with a bipolar junction transistor amplifier 52. The transistor amplifier does not have an inverting input, but a feedback circuit comprising tunneling junction 50 and resistors 54 and 56 can still be used connecting output line 68 to input line 70. The transistor amplifier shown in FIG. 9 is a bipolar junction transistor 52 having an emitter 58, collector 60 and base 62, the emitter 58 being connected to a ground 64 through resistor 66, the base 62 connected as the input of the amplifier and the collector 60 connected as the output of the amplifier. This configuration is known as a "common emitter" amplifier. Other possible configurations of bipolar junction transistor amplifiers that may be clipped using a tunneling junction include a "common base" amplifier in which the base is connected to ground, the emitter is connected as the input and the collector is connected as the output, and a "common collector" amplifier in which the collector is connected to ground, the base is connected as the input and the emitter is connected as the output. The circuit shown assumes correct bias voltages for transistor operation. Where different bias voltages are needed a connection to ground can be replaced by a connection to a power supply rail, for example. In the embodiment shown input line 70 is also connected to ground via resistor 72. FIG. 10 shows a prior art circuit that is the same as the circuit in FIG. 9 except that rather than a tunneling junction the feedback circuit has a loop 74 with parallel diodes 76 and 78. An example of a prior art product using a circuit similar to what is shown in FIG. 10 is the Electro-Harmonix™ Big Muff Pi™, which has two circuits each similar to what is shown in FIG. 10 with resistor 56 omitted and with a capacitor added in series with the parallel diodes and another capacitor added in parallel with resistor 54.

Figure 11:
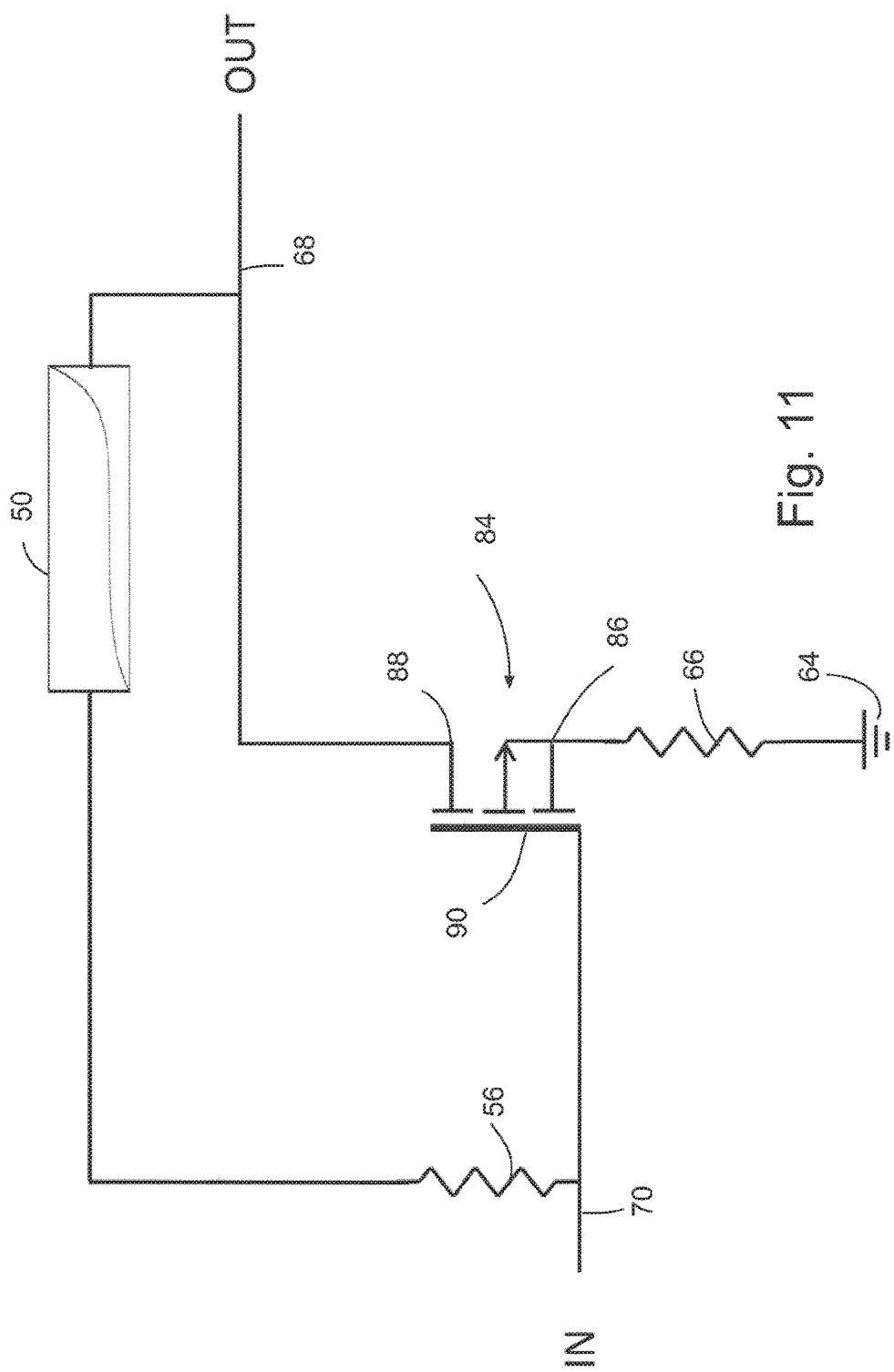
FIG. 11 is a circuit diagram showing a clipping circuit using a tunneling junction with a field effect transistor amplifier.

FIG. 11 is a circuit diagram showing a clipping circuit using a tunneling junction 50 with a field effect transistor amplifier indicated generally as 84. The transistor amplifier 84 does not have an inverting input, but a feedback circuit comprising tunneling junction 50 and resistor 56 can still be used connecting output line 68 to input line 70. The transistor amplifier shown in FIG. 11 is a field effect transistor 84 having a source 86, drain 88 and gate 90, the source 86 being connected to a ground 64 through resistor 66, the gate 90 connected as the input of the amplifier and the drain 88 connected as the output of the amplifier. This configuration is known as a "common source" amplifier. Other possible configurations of field effect transistor amplifiers that may be clipped using a tunneling junction include a "common gate" amplifier in which the gate is connected to ground, the source is connected as the input and the drain is connected as the output, and a "common drain" amplifier in which the drain is connected to ground, the gate is connected as the input and the source is connected as the output. The circuit shown assumes correct bias voltages for transistor operation. Where different bias voltages are needed a connection to ground can be replaced by a connection to a power supply rail, for example.

Figure 12:
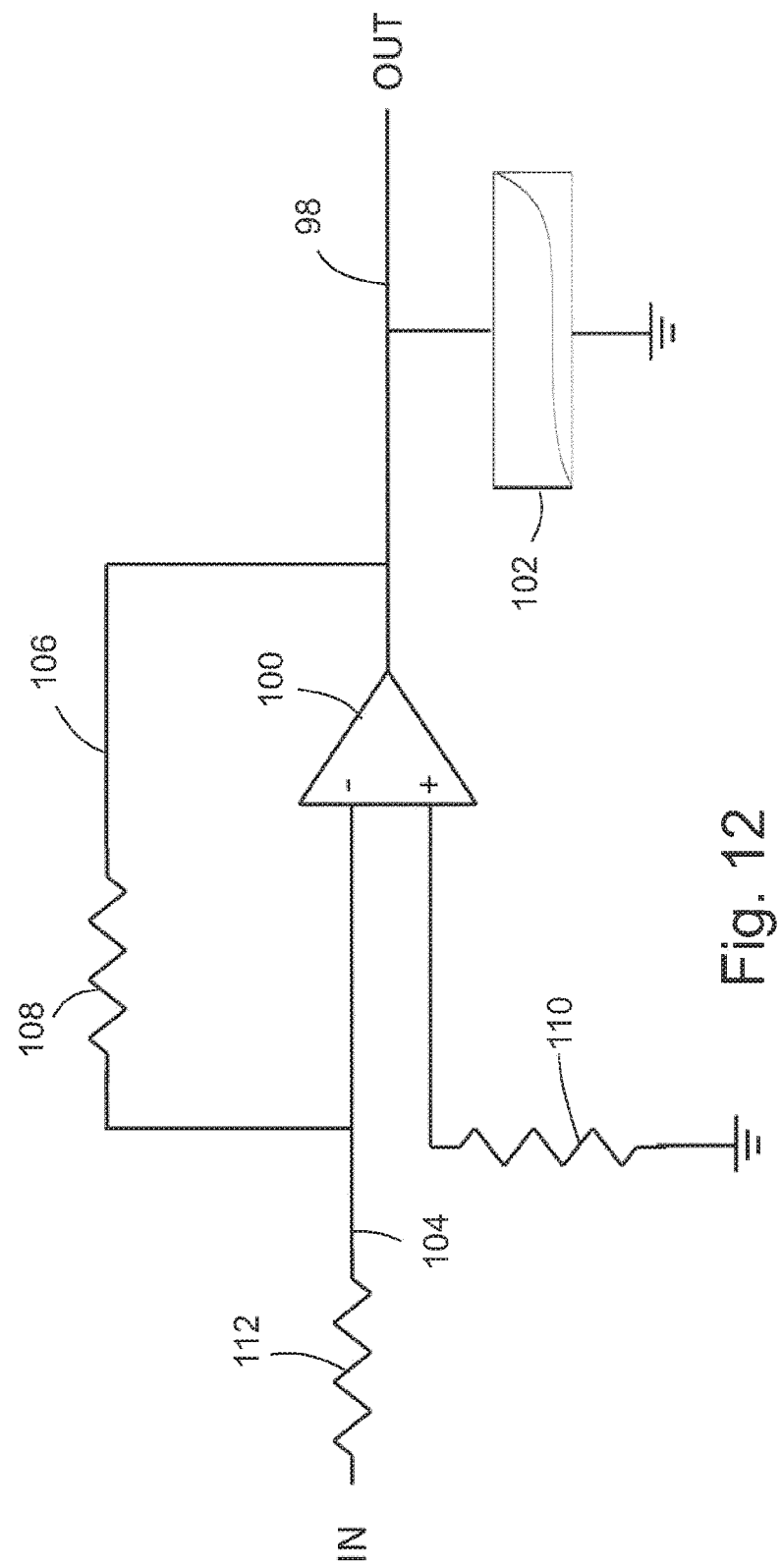
FIG. 12 is a circuit diagram showing hard clipping using a tunneling junction with an op-amp distortion circuit.

In the prior art, soft clipping typically is done using parallel diodes as part of a feedback circuit connecting an output to an input of an amplifier, and hard clipping is typically done using parallel diodes connecting the output of the amplifier to ground. FIG. 12 is a circuit diagram showing hard clipping using a tunneling junction 102 with an op-amp distortion circuit. Output line 98 connects to the output of op-amp 100, and output line 98 is connected to ground through tunneling junction 102. In the embodiment shown input line 104 connects to the inverting input of op amp 100 and feedback line 106 connects output line 98 to input line 104 with resistor 108 on the feedback line. In the embodiment shown the non-inverting input of op-amp 100 is connected to ground through resistor 110. In the embodiment shown input line 104 has a resistor 112. An example of prior art includes the MXR Distortion Plus™ and the ProCo Rat™ Distortion.

Figure 13:
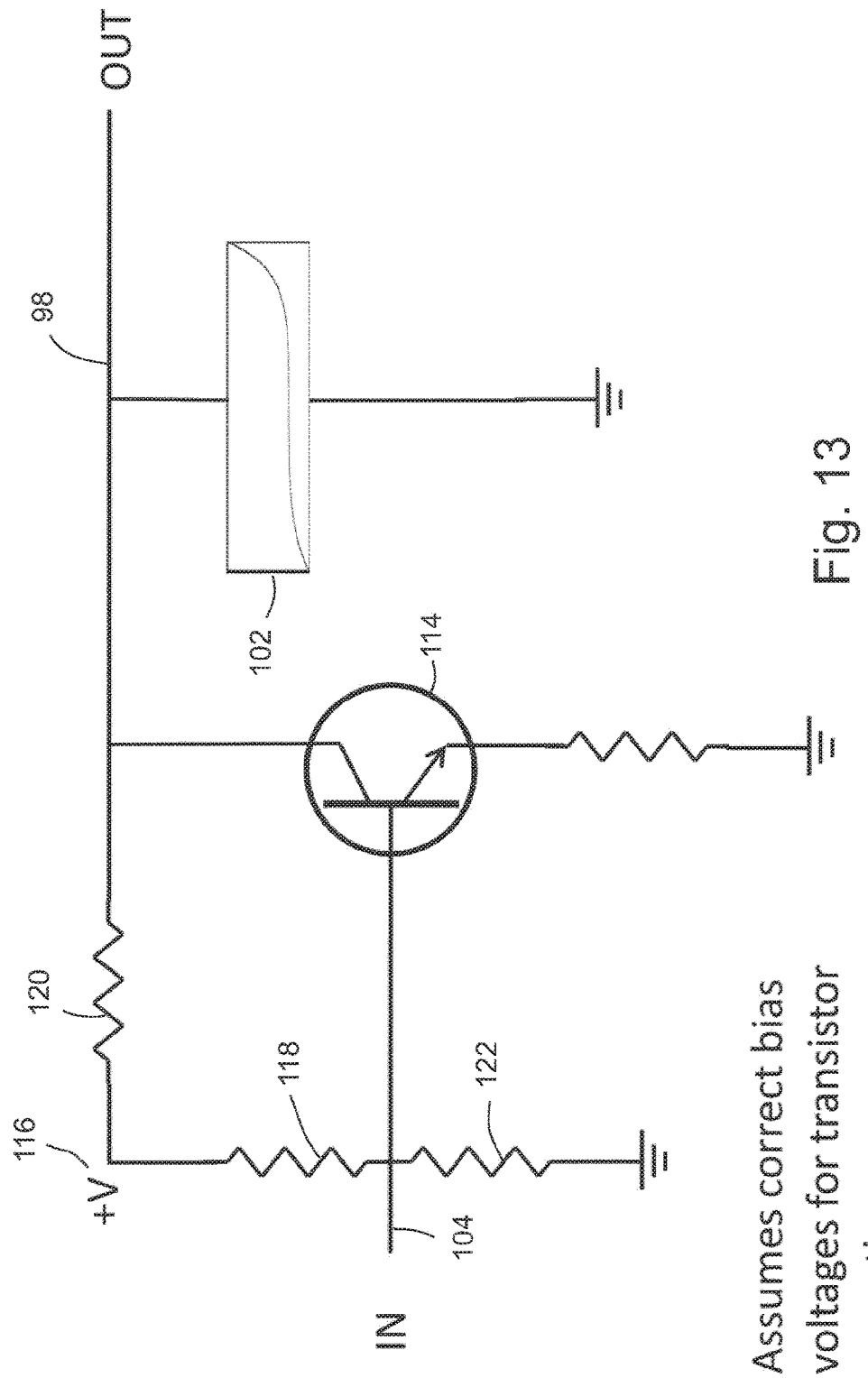
FIG. 13 is a circuit diagram showing hard clipping using a tunneling junction with a bipolar junction transistor distortion circuit.

FIG. 13 is a circuit diagram showing hard clipping using a tunneling junction 102 with a bipolar junction transistor distortion circuit. Output line 98 connects to the output of transistor amplifier 114, and output line 98 is connected to ground through tunneling junction 102. Input line 104 connects to the input of transistor amplifier 114. In the embodiment shown input line 104 is connected to power supply rail 116 through resistor 118, and output line 98 is connected to power supply rail 116 through resistor 120. In the embodiment shown input line 98 is connected to ground through resistor 122. The transistor amplifier in the embodiment shown is connected in a common emitter arrangement as described in relation to FIG. 9. The circuit diagram shown assumes correct bias voltages for transistor operation. Bias voltages can be adjusted for example by changing connections to power supply rails to connections to ground and vice versa.

Figure 14:
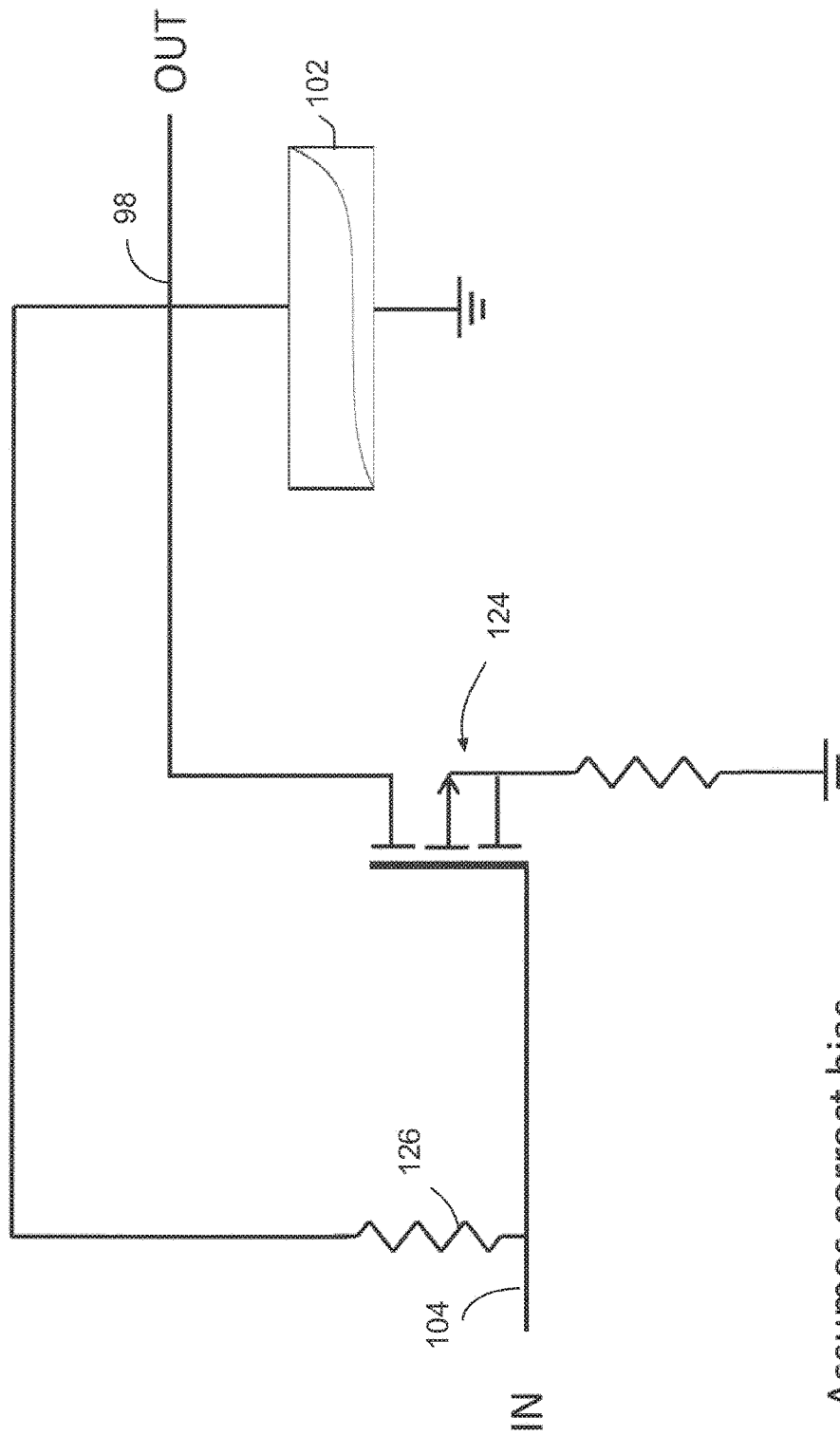
FIG. 14 is a circuit diagram showing hard clipping using a tunneling junction with a field effect transistor distortion circuit.

FIG. 14 is a circuit diagram showing hard clipping using a tunneling junction with a field effect transistor distortion circuit. In the embodiment shown field effect transistor 124 is connected in a common source arrangement as described in relation to FIG. 12. Output line 98 connects to the output of transistor amplifier 114, and output line 98 is connected to ground through tunneling junction 102. Input line 104 connects to the input of transistor amplifier 114. In the embodiment shown output line 98 is connected to input line 104 through resistor 126. The circuit diagram shown assumes correct bias voltages for transistor operation. Bias voltages can be adjusted for example by changing connections to power supply rails to connections to ground and vice versa.

In the above disclosure, input and feedback resistors can be used to control the level of clipping by modifying the amount of the tunneling junction's non-linearity that is used in processing the audio signal. The relationship between the tunneling junction's electronic properties and the size of the input resistor can be used to "tune" the output sound.

In addition to audio clipping circuits, a variety of other embodiments exploiting the non-linearity are possible. The frequency response of molecular junctions is presumably limited by the transit time of electrons across the molecular layer, which is calculated to be <0.1 picosecond for a molecular layer thickness of 10 nm and applied voltage of 1 V. This corresponds to an upper limit on frequency of >1000 GHz, implying that the nonlinear characteristics of a molecular junction should persist to ultrahigh frequencies in the teraHz range. Such frequencies are important in communications, imaging, and related applications which are difficult or may be impossible to address with conventional transistors and semiconductor components.

Exemplary ranges of frequencies of the tunneling junctions disclosed here include 10 Hz to 50 kHz, 50 kHz to 1 GHz and 1 GHz to 10 THz, although in principle the operating frequency only depends on the particular choice of materials and structure of the devices.

Immaterial modifications may be made to the embodiments described here without departing from what is covered by the claims. In the claims, the word "comprising" is used in its inclusive sense and does not exclude other elements being present. The indefinite articles "a" and "an" before a claim feature do not exclude more than one of the feature being present. Each one of the individual features described here may be used in one or more embodiments and is not, by virtue only of being described here, to be construed as essential to all embodiments as defined by the claims.

The invention claimed is:

1. A circuit used as a distortion circuit for an electronic audio signal, the circuit comprising:
   an amplifier having an input line to receive the electronic audio signal and configured to produce an output waveform having harmonic content; and
   a clipping circuit connecting an output of the amplifier to an input of the amplifier or to ground, the clipping circuit including an inorganic or organic tunneling junction, in which the inorganic or organic tunneling junction is formed from a substrate having a contact surface and a monolayer of a plurality of substantially parallel molecular units attached to the contact surface, the monolayer having a thickness to allow quantum mechanical tunneling and variation of the harmonic content of the output waveform, the output waveform having harmonics that decrease in magnitude with increasing frequency and that fall off more rapidly than output from a pair of parallel diodes.

2. The circuit of claim 1 in which the amplifier is an operational amplifier having an inverting input, a non-inverting input, and an output.

3. The circuit of claim 2 in which the clipping circuit connects the output of the operational amplifier to the inverting input of the operational amplifier.

4. The circuit of claim 3 in which the input line is connected to the non-inverting input of the operational amplifier.

5. The circuit of claim 4 further comprising a ground line connecting the input line to a ground, the ground line including a resistor.

6. The circuit of claim 3 in which the input line is connected to the inverting input of the operational amplifier, the input line including a resistor.

7. The circuit of claim 6 further comprising a ground line connecting the non-inverting input of the operational amplifier to a ground.

8. The circuit of claim 1 in which the amplifier is a transistor amplifier.

9. The circuit of claim 8 further comprising a ground line connecting the input line to a ground, the ground line including a resistor.

10. The circuit of claim 8 in which the transistor amplifier comprises a bipolar junction transistor having an emitter, collector and base, the emitter being connected to a ground, the base connected as the input of the amplifier and the collector connected as the output of the amplifier.

11. The circuit of claim 9 in which the transistor amplifier comprises a field-effect transistor having a source, a drain and a gate, the source being connected to a ground, the gate connected as the input of the amplifier and the drain connected as the output of the amplifier.

12. The circuit of claim 1 in which the tunneling junction is an organic tunneling junction.

13. The circuit claim 1 in which the tunneling junction is an inorganic tunneling junction.

14. A method of operating a circuit as a distortion circuit for an electronic audio signal in which the circuit includes an amplifier and a clipping circuit connecting an output of the amplifier to an input of the amplifier or to ground, the output having a waveform with harmonic content, the clipping circuit including an inorganic or organic tunneling junction, in which the inorganic or organic tunneling junction is formed from a substrate having a contact surface and a monolayer of a plurality of substantially parallel molecular units attached to the contact surface, the monolayer having a thickness to allow quantum mechanical tunneling and variation of the harmonic content of the output waveform, the output waveform having harmonics that decrease in magnitude with increasing frequency and that fall off more rapidly than output from a pair of parallel diodes, the method comprising connecting the circuit to receive the electronic audio signal and altering an electronic output of the circuit by controlling the temperature of the inorganic or organic tunneling junction.

15. The circuit of claim 9 in which the transistor amplifier comprises a bipolar junction transistor having an emitter, collector and base, the emitter being connected to a ground, the base connected as the input of the amplifier and the collector connected as the output of the amplifier.

16. The circuit of claim 9 in which the transistor amplifier comprises a field-effect transistor having a source, a drain and a gate, the source being connected to a ground, the gate connected as the input of the amplifier and the drain connected as the output of the amplifier.

17. The circuit of claim 5 in which the tunneling junction is an organic tunneling junction.

18. The circuit of claim 5 in which the tunneling junction is an inorganic tunneling junction.

19. The circuit of claim 1 in which the monolayer of a plurality of substantially parallel molecular units is attached to the contact surface by a conjugated bond.

20. The method of claim 14 in which the monolayer of a plurality of substantially parallel molecular units is attached to the contact surface by a conjugated bond.

* * * * *

UNITED STATES PATENT AND TRADEMARK OFFICE
CERTIFICATE OF CORRECTION

PATENT NO. : 10,164,595 B2  
APPLICATION NO. : 14/909706  
DATED : December 25, 2018  
INVENTOR(S) : Bergren et al.

Page 1 of 1

It is certified that error appears in the above-identified patent and that said Letters Patent is hereby corrected as shown below:

In the Claims

| Column | Line | Error |
|---|---|---|
| 9 (Claim 13) | 10 | "circuit claim 1" should read --circuit of claim 1-- |

Signed and Sealed this  
Twenty-sixth Day of March, 2019

Andrei Iancu  
*Director of the United States Patent and Trademark Office*